United States Patent
Seong

(10) Patent No.: US 8,860,299 B2
(45) Date of Patent: Oct. 14, 2014

(54) ORGANIC LIGHT-EMITTING DISPLAY DEVICE AND METHOD OF MANUFACTURING THE SAME

(71) Applicant: Samsung Display Co., Ltd., Yongin (KR)

(72) Inventor: Ju-Yeop Seong, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 0 days.

(21) Appl. No.: 13/797,139

(22) Filed: Mar. 12, 2013

(65) Prior Publication Data
US 2014/0062292 A1 Mar. 6, 2014

(30) Foreign Application Priority Data
Sep. 4, 2012 (KR) .................. 10-2012-0097867

(51) Int. Cl.
*H01J 63/04* (2006.01)
*H01J 1/62* (2006.01)

(52) U.S. Cl.
USPC ........... 313/504; 313/483; 313/500; 313/501; 313/502; 313/503; 313/505; 313/506

(58) Field of Classification Search
None
See application file for complete search history.

(56) References Cited

U.S. PATENT DOCUMENTS

| | | | |
|---|---|---|---|
| 7,922,552 B2 | 4/2011 | Kwack et al. | |
| 8,087,964 B2 | 1/2012 | Yang et al. | |
| 8,106,583 B2 | 1/2012 | Shin et al. | |
| 8,362,979 B2 * | 1/2013 | Murata et al. | 345/71 |
| 8,466,466 B2 * | 6/2013 | Ha et al. | 257/59 |
| 2011/0220901 A1 | 9/2011 | Ha et al. | |

FOREIGN PATENT DOCUMENTS

| | | |
|---|---|---|
| KR | 10-2007-0056469 A | 6/2007 |
| KR | 10-2009-0128236 A | 12/2009 |
| KR | 10-2010-0102380 A | 9/2010 |
| KR | 10-2011-0101777 A | 9/2011 |

* cited by examiner

*Primary Examiner* — Natalie Walford
(74) *Attorney, Agent, or Firm* — Robert E. Bushnell, Esq.

(57) ABSTRACT

An organic light-emitting display device and a method of manufacturing the same are presented. The organic light-emitting display device includes substrate; a display unit comprising a plurality of emission regions in which organic light-emitting devices are disposed, and a pixel-defining layer having openings defining the emission regions, the emission regions and the pixel-defining film being formed on the substrate; an encapsulation thin film that covers the display unit on the substrate and that comprises a plurality of stacked insulating layers; and a color film that is interposed between the insulating layers of the encapsulation thin film and that is formed to at least fill a concave portion corresponding to each of the openings.

14 Claims, 6 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY DEVICE AND METHOD OF MANUFACTURING THE SAME earlier filed in the Korean Intellectual Property Office on 4 Sep. 2012 and there duly assigned Serial No. 10-2012-0097867.

BACKGROUND OF THE INVENTION

1. Field of the Invention

The present invention relates to an organic light-emitting display device and a method of manufacturing the same, and, more particularly, to an organic light-emitting display device including an encapsulation thin film, and a method of manufacturing the organic light-emitting display device.

2. Description of the Related Art

In recent years, display devices have been replaced by portable thin flat panel display devices. Of the flat panel display devices, an organic or an inorganic light-emitting display device, which is a self-luminous display device, offers the advantages of not only wide viewing angles and excellent contrast, but also fast response speeds, and thus these devices are attracting attention as new generation display devices. Also, the organic light-emitting display devices, in which a formative substance of the emitting layer consists of organic matter, offer the advantages of excellent brightness, low driving voltages, good response speeds and possible display of color images. The comparable inorganic light-emitting display devices are less impressive in these areas.

An organic light-emitting display device may include a display on a substrate and an encapsulation member covering and encapsulating the display. In recent years, in order to form a thinner organic light-emitting display device and to manufacture a flexible organic light-emitting display device, an encapsulation thin film has been used as the encapsulation member rather than casting a glass substrate in the role of an encapsulation member. When the glass substrate is used as the encapsulation member, a color filter is adhered to an inner surface of the glass substrate; however, an encapsulation thin film cannot be formed in the same manner, and the encapsulation thin film must be formed to at least a certain thickness in order to planarize the curvature of a top surface of the display.

SUMMARY OF THE INVENTION

The present invention provides an organic light-emitting display device capable of eliminating the above defects by including a color film and a method of manufacturing the organic light-emitting display device.

According to an embodiment of the present invention, there is provided an organic light-emitting display device including a substrate; a display unit comprising a plurality of emission regions in which organic light-emitting devices are disposed, and a pixel-defining layer having openings defining the emission regions, the emission regions and the pixel-defining layer being formed on the substrate; an encapsulation thin film that covers the display unit on the substrate, the encapsulation thin film comprising a plurality of insulating layers stacked; and at least one color film that is interposed between the insulating layers of the encapsulation thin film and that is formed to at least fill a concave portion corresponding to each of the openings.

According to some embodiments of the present invention, in the color film, a part corresponding to the center of the emission region is thicker than a part corresponding to the edge thereof.

According to some embodiments of the present invention, a top surface of the color film is planar.

According to some embodiments of the present invention, a plurality of the emission regions emit red, green, and blue colors, respectively.

According to some embodiments of the present invention, the color film has the same color as a color emitted from the emission regions.

According to some embodiments of the present invention, the organic light-emitting devices emit a white color.

According to some embodiments of the present invention, the color film has red, green, and blue colors, each corresponding to a group of emission regions.

According to some embodiments of the present invention, the color film includes chromogenic materials and organic materials in which the chromogenic materials are distributed.

According to some embodiments of the present invention, the insulating layers have a structure in which organic and inorganic layers are alternately stacked, and the color film is interposed between the inorganic layers.

According to some embodiments of the present invention, the inorganic layer includes at least one of metal oxides, metal nitrides, metal carbides, and compounds thereof.

According to some embodiments of the present invention, the organic light-emitting devices emit light from the emission regions at least in the direction of the encapsulation thin film.

According to some embodiments of the present invention, the substrate is flexible.

According to another embodiment of the present invention, there is provided a method of manufacturing an organic light-emitting display device, the method including a process of forming a display unit on the substrate; a process of forming an encapsulation thin film to cover a display unit on a substrate by stacking a plurality of insulating layers; and a further process of forming a color film between the insulating layers of the encapsulation thin film.

According to some embodiments of the present invention, the process of forming a display unit on a substrate may further include operations of forming at least one pixel electrode, each pixel electrode being formed in an emission region on the substrate; forming a pixel-defining layer on the at least one pixel electrode, the pixel-defining layer having at least one opening that exposes a center part of the at least one pixel electrode; forming an organic light-emitting layer on the at least one pixel electrode exposed by the at least one opening; forming a counterelectrode on the entire surface of the pixel-defining layer to cover the at least one organic-light emitting layer; and forming a color film to fill the portions corresponding to the openings.

According to some embodiments of the present invention, a top surface of the color film is planar.

According to some embodiments of the present invention, the process of forming the encapsulation thin film may further include an operation of stacking an inorganic layer on the substrate, forming the color film on the inorganic layer, and stacking other inorganic layers on the color film.

BRIEF DESCRIPTION OF THE DRAWINGS

The above and other features and advantages of the present invention will be made more apparent by describing in detail exemplary embodiments thereof with reference to the attached drawings, in which.

DETAILED DESCRIPTION OF THE INVENTION

Figure 1:
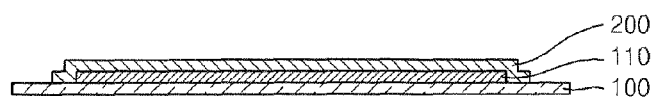
FIG. 1 is a schematic cross-sectional view illustrating a structure of an organic light-emitting display device, according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first", "second", etc., may be used to describe various components, such components must not be limited by the above terms. The above terms are used only to distinguish one component from another.

In the present specification, when a part defined as a layer, film, region, or the like is said to be "above" or "on" at least one other part, it is to be understood that it may not only be "right above" (i.e., immediately adjacent to) the at least one other part, but at least one additional part may also intervene between the part and the at least one other part.

Hereinafter, the present invention will be described in detail by explaining exemplary embodiments of the invention with reference to the attached drawings, and in the description of the present invention with the drawings, practically identical or corresponding components will be given the same reference number, and the duplicate description will be omitted. In order to show the various layers and regions clearly in the drawings, their thicknesses may be exaggerated.

FIG. 1 is a schematic cross-sectional view illustrating a structure of an organic light-emitting display device, according to an embodiment of the present invention.

Referring to FIG. 1, the organic light-emitting display device may include a substrate 100, a display unit 110 formed on the substrate 100, and an encapsulation thin film 200 to cover the display unit 110 on the substrate 100.

The substrate 100 may be a flexible substrate. A flexible substrate may be formed of plastic material with excellent heat-resistance and durability, such as polyethylene terephthalate (PET), polyethylene naphthalate (PEN), polycarbonate (PC), polyallylate, polyetherimide (PEI), polyethersulphone (PES), and polyimide (PI), or the like, but is not limited thereto. For example, a variety of materials with flexibility may be used. On the other hand, the present invention is not limited thereto, and the substrate 100 may be a rigid substrate, which can be made of glass material in which the main component is $SiO_2$.

In the case of a bottom emission type of display device in which an image is displayed by a light-emitting layer in the direction of the substrate 100, the substrate 100 needs to be formed of transparent material. However, in the case of a top emission type display device in which an image is displayed by a light-emitting layer in a direction opposite to that in which the substrate 100 lies, the substrate 100 does not need to be formed of transparent material. In the latter case, the substrate 100 may be formed of metal. When the substrate 100 is made of metal, the substrate 100 may include at least one material selected from carbon, iron, chromium, manganese, nickel, titanium, molybdenum, and stainless steel (SUS). However the substrate 100 is not limited thereto, and the substrate 100 may be formed of metal foil.

The display unit 110 is disposed on top of the substrate 100. The display unit 110 is collectively understood to mean an organic light-emitting device (OLED) and a thin film transistor (TFT) array to support the OLED, meaning that a reference to display unit 110 includes both a part displaying an image and a driving part to define the image.

The encapsulation thin film may be formed on top of the substrate 100 to cover the display unit 110. The OLEDs included in the display unit 110 consist of at least one organic material, so the OLEDs may easily be deteriorated by moisture or oxygen that penetrate from the outside. Therefore, in order to protect the display unit 110, the display unit 110 needs to be covered. The encapsulation thin film 200 has a structure in which organic and inorganic layers are alternately stacked to cover the display unit 110. On the other hand, by covering the display unit 110 with the encapsulation thin film 200 rather than with an encapsulation substrate, it is possible to planarize the organic light-emitting display device and also make the organic light-emitting display device flexible.

Figure 2:
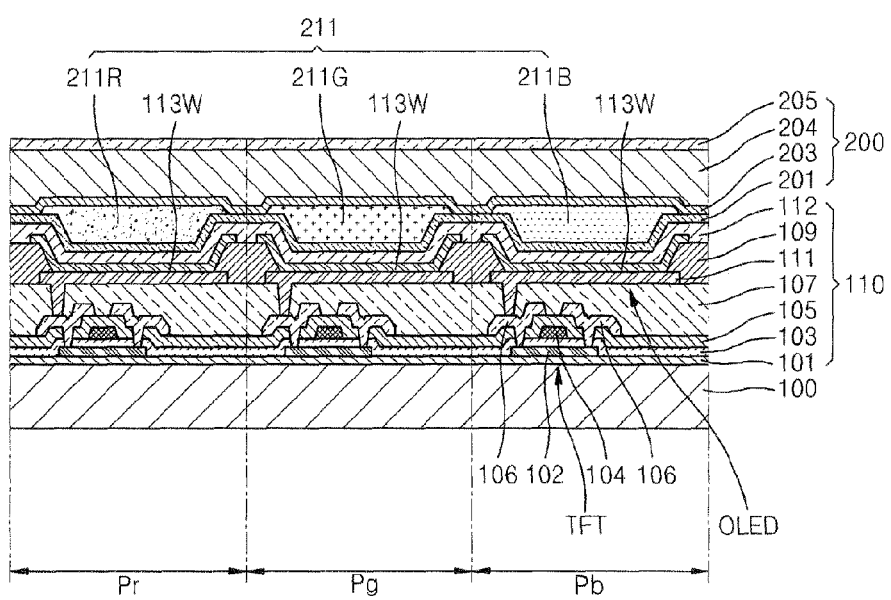
FIG. 2 is a cross-sectional view illustrating a portion of the organic light-emitting display device of FIG. 1 in detail, according to an embodiment of the present invention.
Figure 3:
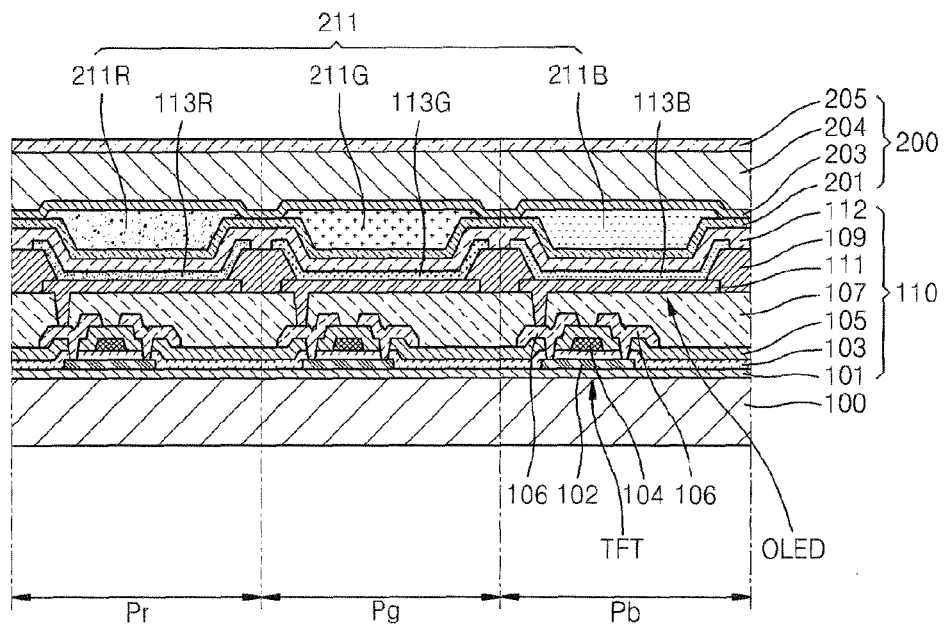
FIG. 3 is a cross-sectional view illustrating a portion of an organic light-emitting display device, according to another embodiment of the present invention.

FIG. 2 is a cross-sectional view illustrating a portion of the organic light-emitting display device of FIG. 1 in detail. FIG. 2 illustrates a specific cross section of the display unit 110 and a specific cross section of the encapsulation thin film 200. Viewing an OLED of the invention from a perspective outside of the plane of the display unit 110 shows that a plurality of pixels arranged in a matrix form, each pixel including a red pixel (Pr) emitting red color, a green pixel (Pg) emitting green color, and a blue pixel (Pb) emitting blue color, respectively. FIG. 3 illustrates a cross-section of each color for convenience of description.

Each pixel includes OLEDs and an electronic device that is electrically connected to the OLEDs. The electronic device can include at least two TFTs, storage capacitors, or the like. The electronic device works by electrically connecting to display control circuitry and receiving electrical signals from the external drive of the display unit 110, transmitting to the OLEDs instructions for forming the image to be displayed. Such an electronic device, which is electrically connected to the OLEDs, and an associated arrangement of circuitry are referred to as a TFT array.

For convenience of description, FIG. 2 illustrates only the OLEDs and the driving TFTs for each pixel that drives the OLEDs. However, embodiments of the present invention are not limited thereto, and a large number of TFTs, storage capacitors, and various circuitry may be further included.

The TFT illustrated in FIG. 2 is a top gate type TFT. The TFT sequentially includes an active layer 102, a gate electrode 104, and source or drain electrodes 106 in this order.

According to an aspect of the present invention, a top gate type TFT is disclosed. However, the present invention is not limited thereto, and other TFTs may be used.

A buffer layer 101 may be formed on top of the substrate 100 in order to planarize a surface and to block the penetration of contaminants. The buffer layer 101 may be deposited by various deposition methods such as one of plasma-enhanced chemical vapor deposition (PECVD), atmospheric pressure CVD (APCVD), low pressure CVD (LPCVD), and the like, using $SiO_2$ and/or SiNx. The buffer layer 101 may be optional, depending on the need.

In each pixel, the active layer 102 may be formed on the buffer layer 101. The active layer 102 may be formed by patterning after forming inorganic semiconductors, such as silicon, oxide semiconductors, or the like, or organic semiconductors on the entire surface of the buffer layer 101, which may be on the substrate 100. When forming the active layer 102 with silicon, an amorphous silicon layer may be formed on the entire surface of the substrate 100, then crystallized. Then, after patterning a polycrystalline silicon layer to form the active layer 102, the active layer 102 is doped with impurities to form a source region and a drain region. Thus, the active layer 102 includes the source and drain regions and the channel region between the source and drain regions.

On the active layer 102, a gate insulating layer 103 is formed, the gate insulating layer 103 being formed of $SiO_2$, SiNx, or the like. On a predetermined region of the gate insulating layer 103, the gate electrode 104 may be formed. The gate electrode 104 may be connected to a gate line (not shown) via which an on/off signal of the TFT is applied.

An interlayer insulating layer 105 may be formed on top of the gate electrode 104, and the source and drain electrodes 106 may be formed to be in contact with source and drain regions of the active layer 102, respectively, through contact holes. Then, the formed TFT may be covered with a passivation layer 107 for protection.

The passivation layer 107 may include an inorganic insulating layer and/or an organic insulating layer. The inorganic insulating layer may include one of $SiO_2$, SiNx, SiON, $Al_2O_3$, $TiO_2$, $Ta_2O_5$, $HfO_2$, $ZrO_2$, barium strontium titanate (BST), lead zirconate titanate (PZT), and the like, and the organic insulating layer may include general-purpose polymers, for example, one of polymethylmethacrylate (PMMA), polystyrene (PS), a polymer derivative having a phenolic group, an acrylic polymer, imide-based polymers, aryl ether-based polymers, amide-based polymers, fluorine-containing polymers, p-xylene-based polymers, vinyl alcohol-based polymer, and a blend of these. Also, the passivation layer 107 may be formed as a stacked composite of the inorganic and the organic insulating layers.

In the emission regions of the top surface of the passivation layer 107, OLEDs may be provided.

The OLEDs may include a pixel electrode 111 formed on the passivation layer 107, the counter electrode 112 facing the pixel electrode 111, and an intermediate layer disposed therebetween.

The organic light-emitting display device, depending on the direction of emitted light, is classified as one of a bottom emission type display device, a top emission type display device, and a dual emission type display device. In the case of a bottom emission type display device, the pixel electrode 111 is a light transmissive electrode and the counter electrode 112 is a reflective electrode. In the case of a top emission type display device, the pixel electrode 111 is a reflective electrode and the counter electrode 112 is a transmissive electrode.

Here, a top emission type display device in which the OLEDs emit light in the direction of the encapsulation thin film 200 is described.

The pixel electrode 111 includes a reflecting film, formed of a material selected from Ag, Mg, Al, Pt, Pd, Au, Ni, Nd, Ir, Cr, and compounds thereof, and a transparent film formed of a material selected from indium tin oxide (ITO), indium zinc oxide (IZO), ZnO, $In_2O_3$, and the like and having a high work function. The pixel electrode 111 may be formed by patterning into an island form, the islands corresponding to each pixel. Also, the pixel electrode 111 may function as an anode electrode when the pixel electrode 111 is connected to an external terminal (not shown).

On the pixel electrode 111, the pixel-defining layer 109 that covers the edge of the pixel electrode 111 and has a predetermined opening exposing the center of the pixel electrode 111 is disposed. The emission region is defined by depositing an organic light-emitting layer 113W that emits light to the openings in a limited region (FIGS. 5-9). When forming the emission regions corresponding to the openings in the pixel-defining layer 109, non-light-emitting regions of the display surface are also formed in areas where the organic light-emitting layer is not formed.

The counter electrode 112 may be provided as a transmissive electrode and may be a thin semi-permeable film formed of metal having a small work function, such as one of Li, Ca, LiF/Ca, LiF/Al, Al, Mg, or Ag, and the like. Also, a transparent conductive thin film, such as one of ITO, IZO, ZnO, $In_2O_3$, and the like, may be formed on the metal semi-permeable film to compensate for a high resistance problem caused by the thickness of the metal semi-permeable film. The counter electrode 112 may be formed as a common electrode on the entire surface of the substrate 100. Also, the counter electrode 112 may function as a cathode electrode when it is connected to an external terminal, not shown.

The pixel electrode 111 and the counter electrode 112 as described above may have opposite polarities to each other.

The intermediate layer may include the organic light-emitting layer 113W, the organic light-emitting layer 113W being formed of low molecular weight organic material or polymer organic material. If the organic light-emitting layer 113W includes a low molecular weight organic layer formed of low molecular weight organic material, a hole transport layer (HTL) and a hole injection layer (HIL) or the like are stacked in the direction of the pixel electrode 111 from the organic light-emitting layer 113W, and an electron transport layer (ETL) and an electron injection layer (EIL) or the like are stacked in the direction of the counter electrode 112 from the organic light-emitting layer 113W. Also, various layers other than the HIL, the HTL, the ETL, and the EIL may be may be formed, depending on the need.

On the other hand, if the organic light-emitting layer 113W includes a polymer layer formed of polymer organic material, an HTL may be the only other layer needed to complete the assembly of the intermediate layer, and the HTL may be arranged in the direction of the pixel electrode 111 from the organic light-emitting layer 113W. A polymeric HTL may be formed on top of the pixel electrode 111 by one of inkjet printing and spin coating using one of poly-(2,4)-ethylenedihydroxy thiophene (PEDOT), polyaniline (PANI), and the like.

As shown in FIG. 2, the OLEDs, according to an embodiment of the present invention, emit white color by electrical driving of the pixel electrode 111 and the counter electrode 112. The white color emitted from the organic light-emitting layer 113W here may be advantageous if the white color has a good Color Rendering Index (CRI)(>75) and approximately has coordinates (0.33, 0.33) in the CIE diagram, but the invention is not necessarily limited thereto.

Regarding a method for the organic light-emitting layer 113W to produce white color, a method of wave conversion, which is down conversion, a method of color mixing, or the like may be used. The method of down conversion involves forming a wavelength spectrum with a wide wavelength range by exciting phosphors to produce blue or violet color and mixing a variety of colors emitted from the phosphors. The method of color mixing involves forming white color by mixing two default colors (blue and orange) or three default colors (red, green, blue). However, the present invention is not limited thereto, and a variety of materials and methods that implement white color may be applied.

As described above, the encapsulation thin film 200 is formed on the substrate 100 to cover the display unit 110. The encapsulation thin film 200 is made of stacked insulating layers, and, more particularly, a plurality of insulating layers that have a structure in which an organic layer 204 and inorganic layers 201, 203, and 205 are alternately stacked.

The inorganic layers 201, 203, and 205 may be composed of at least one of metal oxides, metal nitrides, metal carbides, and compounds thereof; for example, one of aluminum oxide, silicon oxide, and silicon nitride. The inorganic layers 201, 203, and 205 function to inhibit the penetration of external moisture, oxygen, or the like into the OLEDs. The organic layer 204 may be a polymeric organic compound including at least one of epoxy, acrylate, and urethane acrylate. The organic layer 204 functions to relieve internal stress of the inorganic layers 201, 203, and 205, to complement defects of the inorganic layers 201, 203, and 205, and to planarize.

According to an embodiment of the present invention, the color film 211 may be interposed between the inorganic layers 201 and 203 of the encapsulation thin film 200. The color film 211 may serve as a color adjusting member, like a color filter, and simultaneously may complement a role of the encapsulation thin film 200.

The color film 211 includes chromogenic materials and organic materials in which chromogenic materials are distributed. The chromogenic materials may be common pigments or dyes, and the organic materials may be common dispersing agents. The color film 211 selectively passes light of a specific wavelength, such as red, green, or blue, from white emitted from the OLEDs, and absorbs the other wavelengths of the light to emit one of red, green, and blue from each pixel. Color films 211R, 211G, and 211B, for red, green, and blue, may be disposed to correspond to each emission region, and the emission regions emit red, green, and blue.

Color films 211 may be formed on the concave portions of the display unit 110 in order to relieve internal stress in the encapsulation thin film 200, to complement defects of the encapsulation thin film 200, and to planarize. The color films 211 may be interposed between the insulating layers of the encapsulation thin film 200 and may be disposed in areas corresponding to the emission regions to at least fill the concave portions that correspond to the openings in the pixel-defining layer 109. In more detail, on top of the counterelectrode 112 in the OLEDs, the inorganic layer 201 of the encapsulation thin film 200 may be formed, and on top of the inorganic layer 201 corresponding to the emission regions, the color film 211 is formed. Also, on top of the color film 211, the inorganic layer 203 is stacked. The color film 211 is interposed between the inorganic layers 201 and 203.

In the color film 211, an area corresponding to the center of the emission region may be thicker than an area corresponding to the edge thereof. The top surface of the color film 211 may then have a planar structure. Herein, the portion corresponding to the center of the emission region may be the portion where the pixel electrode 111 is exposed through the opening, and the portion corresponding to the edge of the emission region may be the portion corresponding to the wall of the opening in the pixel-defining layer 109. The pixel-defining layer 109 may be formed to have an interface with a surface of the substrate 100, and the wall of the opening in pixel-defining layer 109 may have a predetermined angle of inclination. The inclined walls in the openings in pixel-defining layer 109 may aid in eliminating the shadow effect that might otherwise interfere with the deposition process of the organic light-emitting layer 113W on the opening. The shape of these inclined walls may also act to prevent the organic light-emitting layer 113W from detaching from pixel electrode 111 and being lifted out of place. Additionally, designing the openings in pixel-defining layer 109 with inclined walls may have the advantage of leading to fewer defective openings. In order to form the advantageous design feature of a planar structure on the top of the color film 211, the portion of the color film 211 corresponding to the wall of the opening that defines the edges of the emission region needs to have a shape in which the thickness decreases depending on the inclination of the opening wall.

If the top of the color film 211 is almost planar, the encapsulation thin film 200 may be made thinner. The organic layer 204 in the encapsulation thin film 200, in which the inorganic layers 201/203 and 205 and the organic layer 204 are alternately stacked, is formed thicker than the inorganic layers 201, 203, and 205 to compensate for defects of the inorganic layers 201, 203, and 205 and to planarize. When the color film 211, which complements the curvature of the display unit 110 and planarizes the entire top surface of the substrate 100, is formed, it is possible to reduce the number of layers or the thickness of the organic layer 204 included in the encapsulation thin film 200.

Though not shown in the Figures, the top surface of the color film 211 may be at almost the same level as the top surface of the pixel-defining layer 109. Alternatively, the top surface of the color film 211 may be formed below the top surface of an inorganic pixel-defining layer 109. The color film 211 may be completely embedded in the surrounding pixel-defining layer 109, with the surface of color film 211 being at or below the rim of the opening of the pixel-defining film 109.

FIG. 3 is a cross-sectional view illustrating a portion of an organic light-emitting display device, according to another embodiment of the present invention.

Referring FIG. 3, the organic light-emitting display device according to another embodiment of the present invention is different from the previous embodiment in that each of the organic light-emitting layers 113R, 113G, and 113B of the organic light-emitting display device emits one of red, green, and blue for each pixel. In the previous embodiment, the organic light-emitting layers 113W were depicted to emit white light, which then passed through color filters particular to each pixel. Also, the same reference numbers in FIG. 3 as those in FIG. 2 refer to the same components. Since identical components have the same features or functions, repeated descriptions are omitted below.

As illustrated in FIG. 3, the OLEDs according to an embodiment of the present invention emit one of red, green, and blue for each pixel by electrical driving of the pixel electrode 111 and the counter electrode 112. The color film 211 has the same color as the one emitted from the OLEDs. For example, the red color film 211R is disposed in a portion corresponding to the red-emitting region, the green color film 211G is disposed in a portion corresponding to the green-emitting region, and the blue color film 211B is disposed in a portion corresponding to the blue-emitting region. With respect to the embodiment shown in FIG. 3, color film 211 may complement the role of the encapsulation thin film 200, and this role may overshadow its role as a color adjusting member.

FIGS. 4 through 9 are schematic cross-sectional views sequentially illustrating a method of manufacturing an organic light-emitting display device, according to an embodiment of the present invention. FIG. 10 summarizes the steps in a manufacturing method according to an embodiment of the present invention, but the present invention is not limited thereto.

The description of a process of forming the TFT array on the substrate 100 is omitted since it is a general process. FIGS. 4 through 9 illustrate a method of manufacturing the organic light-emitting display device shown in FIG. 2. However, the method also applies to a method of manufacturing the organic light-emitting display device shown in FIG. 3.

Figure 4:
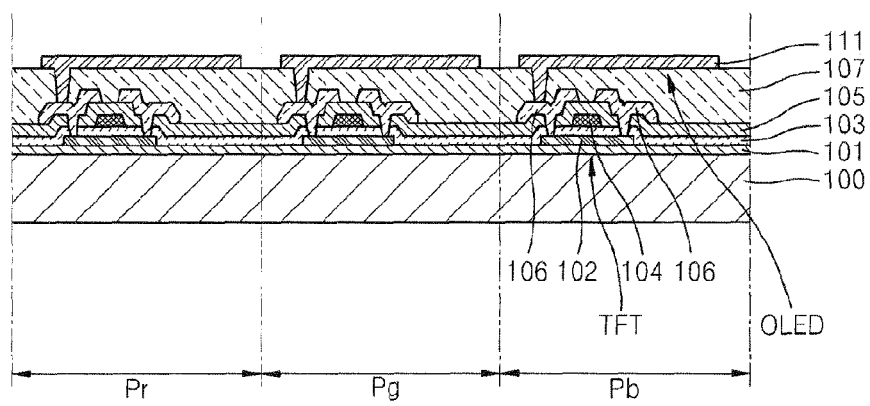
FIGS. 4 through 9 are schematic cross-sectional views sequentially illustrating a method of manufacturing an organic light-emitting display device, according to an embodiment of the present invention.

Referring to FIG. 4, the pixel electrode 111 is formed on the TFT array. The pixel electrode 111 is formed by patterning into an island form for each pixel after forming a metal layer and a metal layer of oxides by a deposition method. The metal layer is formed of Ag, Mg, Al, Pt, Pd, Au, Ni, Nd, Ir, Cr, and compounds thereof, and the metal layer of oxides is formed of one of ITO, IZO, ZnO, or $In_2O_3$, and the like.

Figure 5:
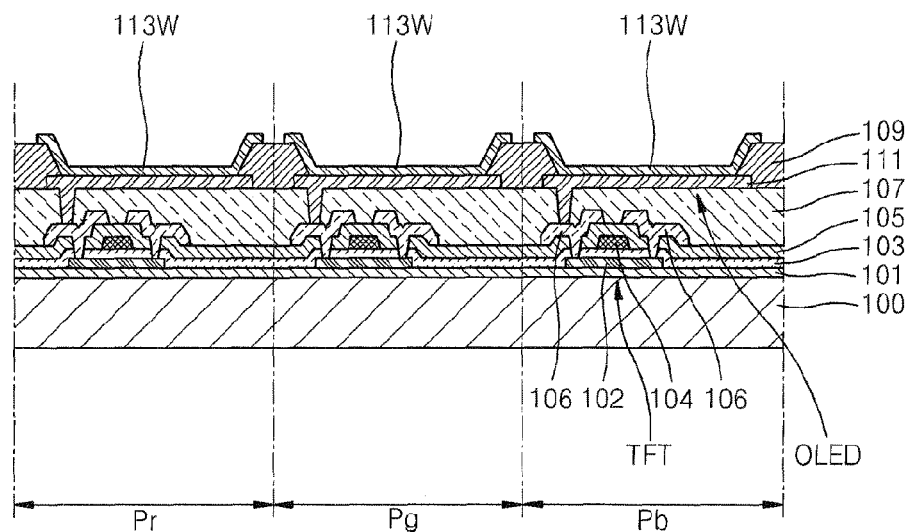

Next, referring to FIG. 5, the pixel-defining layer 109, which is an insulator partially covering the pixel electrode 111, may be formed partially on the pixel electrode 111 with a predetermined thickness. The pixel-defining layer 109, which is comprised of at least one organic insulating material selected from polyimide, polyamide, acrylic resin, benzocyclobutene and phenolic resin, may be formed by spin coating or the like. The emission region may be defined by forming a predetermined opening in the pixel-defining layer 109 to expose in the center part of the opening the pixel electrode 111, and by depositing the organic light-emitting layer 113W that emits light in limited regions through the openings.

Figure 6:
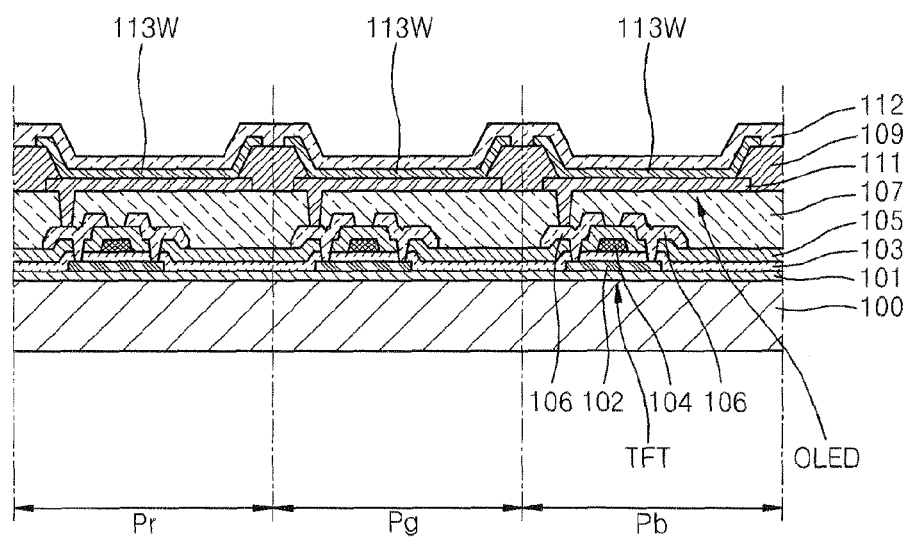

Next, referring to FIG. 6, the counterelectrode 112 may be formed using a deposition method as a thin semi-permeable film, using metals such as one of Li, Ca, LiF/Ca, LiF/Al, Al, Mg, Ag, and the like.

Figure 7:
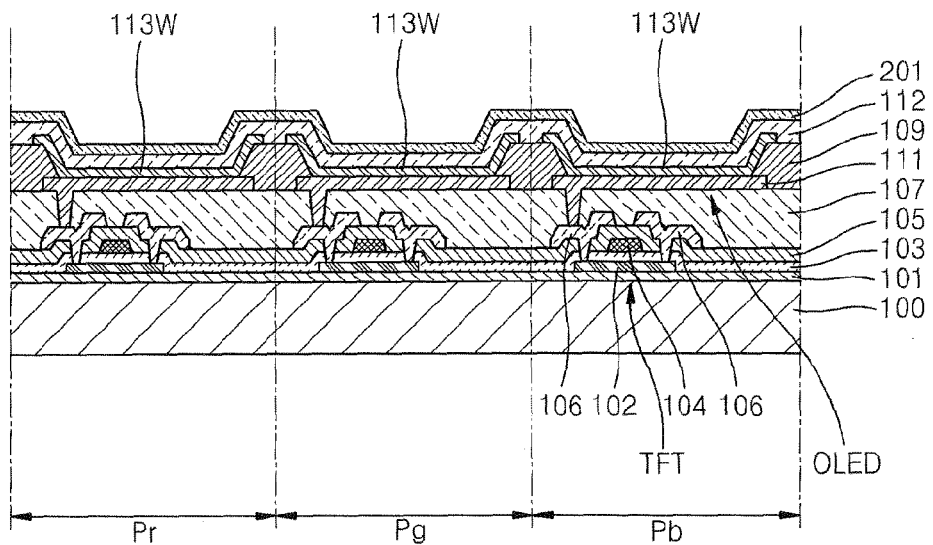

Referring to FIG. 7, on top of the counter electrode 112, the encapsulation thin film 200 may be formed. First, the inorganic layer 201 may be formed to a predetermined thickness. At this time, a separate layer such as a protective layer (not shown) may be further provided between the encapsulation thin film 200 and the OLEDs.

Figure 8:
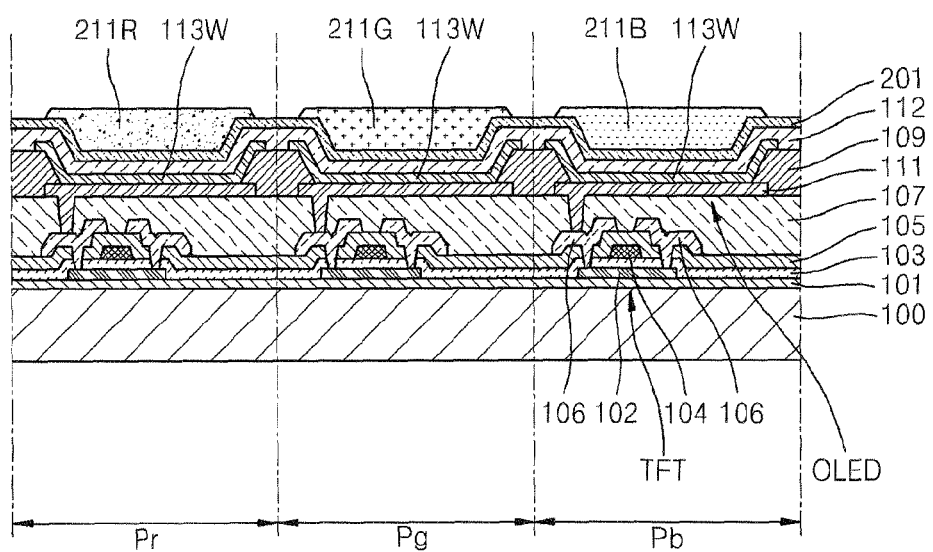

Next, referring to FIG. 8, the color film 211 may be formed on the inorganic layer 201 that corresponds to each emission region. The color film 211 may be formed by an inkjet method or by flash evaporation. Either method involves filling a trench or forming the thickness of a thick film differently than would forming a thin film with uniform thickness, as with a spin-coating method. Using one of an inkjet method and flash evaporation, the color film 211 may be formed to fill the concave portion corresponding to the opening of the pixel-defining layer 109. Also, in the color film 211, an area corresponding to the center of the emission region may be thicker than a part corresponding to the edge thereof. Also, a top surface of the color film 211 may be nearly planar.

Figure 9:
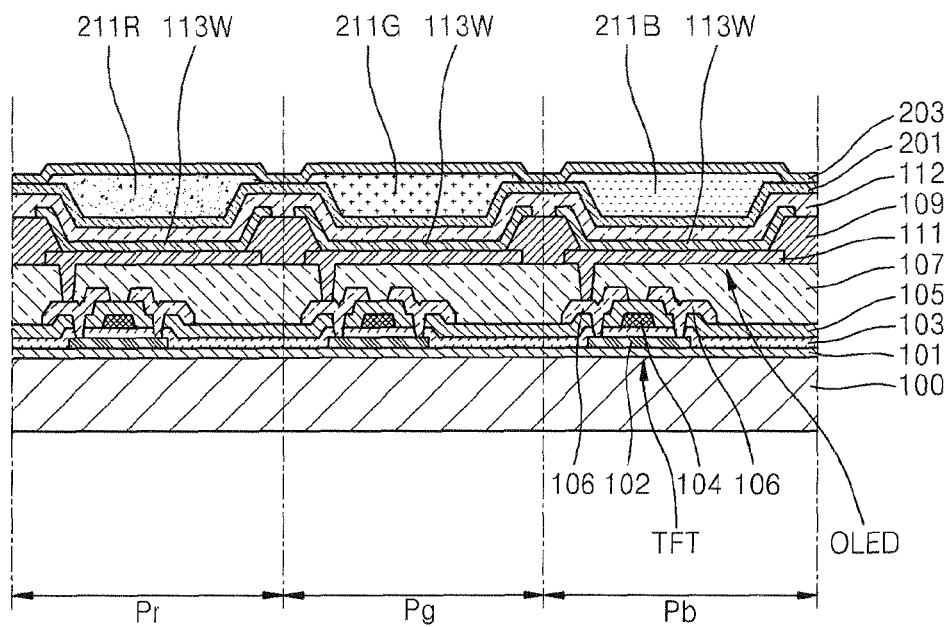
Figure 10:
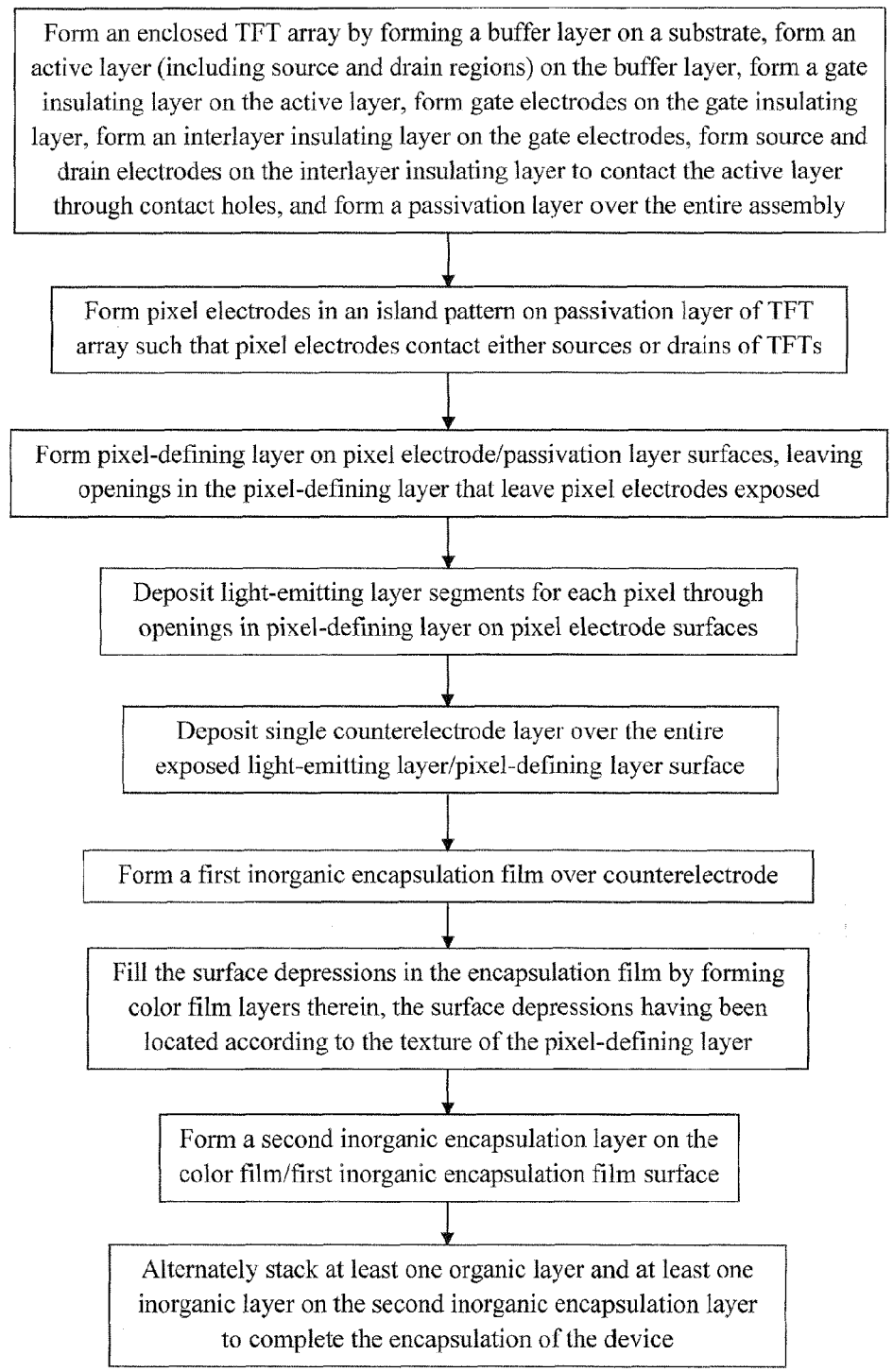
FIG. 10 summarizes the steps in a manufacturing method according to an embodiment of the present invention, but the present invention is not limited thereto.

Referring to FIG. 9, the inorganic layer 203 may be formed on top of the planar color layer 211 and of the inorganic layer 201 corresponding to the top of the pixel-defining layer 109. Depending on the need, the organic layer 204 and the inorganic layer 205 may be further stacked on the inorganic layer 203.

In FIGS. 2 and 3, the OLEDs are shown to be formed on top of the passivation layer 107. However, the present invention is not limited thereto, and the OLEDs may be formed on top of the gate insulating film 103 or the interlayer insulating layer 105 by a method of mask reduction.

The present invention may be applied to a dual emission type organic light-emitting display device, in which both the pixel electrode 111 and the counterelectrode 112 are provided as light transmission electrodes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
a substrate;
a display unit comprising a plurality of emission regions in which organic light-emitting devices are disposed and a pixel-defining layer having openings defining the emission regions, the emission regions and the pixel-defining layer being formed on the substrate;
an encapsulation thin film that covers the display unit on the substrate, the encapsulation thin film comprising a plurality of insulating layers stacked; and
at least one color film that is interposed between the insulating layers of the encapsulation thin film and that is formed to at least fill a concave portion corresponding to each of the openings, an area corresponding to the center of the emission region being thicker than an area corresponding to the edge thereof in the color film.

2. The organic light-emitting display device of claim 1, a top surface of the color film being planar.

3. The organic light-emitting display device of claim 1, a plurality of the emission regions emitting red, green, and blue color, respectively.

4. The organic light-emitting display device of claim 3, the color film having the same color as the color of light emitted from the emission regions.

5. The organic light-emitting display device of claim 1, the organic light-emitting devices emitting a white color.

6. The organic light-emitting display device of claim 5, the color films having red, green, and blue colors corresponding to the emission regions.

7. The organic light-emitting display device of claim 1, the at least one color film comprising chromogenic materials and organic materials in which the chromogenic materials are distributed.

8. The organic light-emitting display device of claim 1, the insulating layers having a structure in which organic and inorganic layers are alternately stacked, the color film being interposed between the inorganic layers.

9. The organic light-emitting display device of claim 8, the inorganic layer comprising at least one of metal oxides, metal nitrides, metal carbides, and compounds thereof.

10. The organic light-emitting display device of claim 1, the organic light-emitting devices emitting light in the direction of the encapsulation thin film.

11. The organic light-emitting display device of claim 1, the substrate being flexible.

12. A method of manufacturing an organic light-emitting display device, the method comprising:
forming a display unit on a substrate, the step of forming the display unit comprising:
forming at least one pixel electrode, each pixel electrode being formed in an emission region on the substrate;

forming a pixel-defining layer on the at least one pixel electrode, the pixel-defining layer having at least one opening that exposes a center part of the at least one pixel electrode;

forming an organic light-emitting layer on the at least one pixel electrode exposed by the at least one opening; and forming a counterelectrode on the entire surface of the pixel-defining layers to cover the at least one organic light-emitting layer, the display unit having at least one concave portion on an exposed surface of the counterelectrode corresponding to the at least one opening; and forming an encapsulation thin film to cover the display unit on the substrate by stacking a plurality of insulating layers, the forming of the encapsulation thin film further comprising forming a color film between the insulating layers of the encapsulation thin film, the color film being formed to fill the at least one concave portion corresponding to the at least one opening, an area corresponding to the center of the emission region being thicker than an area corresponding to the edge thereof in the color film.

13. The method of claim 12, a top surface of the color film being formed planar.

14. The method of claim 12, the plurality of insulating layers comprising a plurality of inorganic layers, the step of forming the encapsulation thin film further comprising stacking at least one of the inorganic layers on the substrate, forming the color film on the inorganic layer, and stacking other inorganic layers on the color film.

* * * * *